(12) United States Patent
Samavati

(10) Patent No.: US 7,847,613 B1
(45) Date of Patent: Dec. 7, 2010

(54) VARIABLE TRANSCONDUCTANCE MIXER SYSTEM

(75) Inventor: Hirad Samavati, Santa Clara, CA (US)

(73) Assignee: Atheros Communications Inc., Santa Clara, CA (US)

( * ) Notice: Subject to any disclaimer, the term of this patent is extended or adjusted under 35 U.S.C. 154(b) by 0 days.

(21) Appl. No.: 12/204,310

(22) Filed: Sep. 4, 2008

Related U.S. Application Data

(60) Provisional application No. 60/973,143, filed on Sep. 17, 2007.

(51) Int. Cl.
*G06F 7/44* (2006.01)

(52) U.S. Cl. .................... 327/359; 327/355; 327/361; 330/254; 455/326

(58) Field of Classification Search ......... 327/355–361; 330/254; 455/326, 333
See application file for complete search history.

(56) References Cited

U.S. PATENT DOCUMENTS

| | | | | |
|---|---|---|---|---|
| 5,093,634 A | * | 3/1992 | Khoury | 331/108 B |
| 5,334,891 A | * | 8/1994 | Marbot | 327/281 |
| 2007/0075774 A1 | * | 4/2007 | Yoshizawa et al. | 330/254 |
| 2008/0297250 A1 | * | 12/2008 | Yee | 330/254 |
| 2008/0305759 A1 | * | 12/2008 | Tervaluoto et al. | 455/326 |

* cited by examiner

*Primary Examiner*—Lincoln Donovan
*Assistant Examiner*—Shikha Goyal
(74) *Attorney, Agent, or Firm*—Rosenberg, Klein & Lee

(57) ABSTRACT

A variable transconductance device for a mixer apparatus is provided. The apparatus includes at least one variable current source circuit having a plurality of selectively enabled current source stages. Each of the current source stages, when enabled, is actuable to establish a conductive path between a first supply level and an output terminal. The device further includes at least one variable transconductance circuit having a plurality of selectively enabled transconductance stages. Each transconductance stage, when enabled, is actuable to establish a conductive path between a second supply level and the output terminal. An output current signal is generated at the output terminal responsive to actuation of the variable transconductance circuit by an input voltage signal, whereby the output current signal exhibits a power gain adjustably determined responsive to the numbers of current source and transconductance stages selectively enabled.

18 Claims, 8 Drawing Sheets

VARIABLE TRANSCONDUCTANCE MIXER SYSTEM

RELATED APPLICATION DATA

This Application is based upon U.S. Provisional Patent Application 60/973,143, filed 17 Sep. 2007.

BACKGROUND OF THE INVENTION

The subject variable transconductance mixer system is generally directed to a system for receiving an electromagnetic signal and preparing for further processing downstream. More specifically, the subject variable transconductance mixer system is one which may be selectively configured to realize an adjustable power gain in the signal for modulation with a local oscillator (LO) signal, and to do so with minimal noise effect.

In communication systems, electromagnetic signals within a wide range of frequencies and signal attributes are received and processed. One of the initial steps in receiving and processing such signals is to down-convert the received signal to an intermediate frequency by mixing, or modulating, with a local oscillator signal of predetermined frequency. Various mixer topologies are known in the art. Two general types of mixer topologies, such as illustrated in FIGS. 1A and 1B, are commonly used in the art. FIG. 1A illustrates an active mixer of the type commonly referred to as a Gilbert-cell mixer, while FIG. 1B illustrates a passive mixer.

Such mixer types offer different advantages and disadvantages. A significant advantage of the active mixer type of FIG. 1A is that it may provide signal power gain. That is, the mixer may provide an output signal greater in power than the input signal. This is an important factor in many applications because the power gain tends to alleviate the noise contribution of downstream processes which follow the mixer. Another significant advantage of such active mixers is that they obviate the need for excessively large LO swing amplitudes invariably found with passive mixers. This eases design requirements for local oscillator buffers and the like.

Despite their notable advantages, active mixer topologies typically suffer from significant flicker (1/f) noise problems. The flicker noise problem which results from the flow of DC current in the mixer's core circuitry raises serious, even prohibitive, concerns in some radio applications.

On the other hand, passive mixer topologies of the type illustrated in FIG. 1B typically exhibit far better noise performance, generally, than active mixer topologies, mainly for the reason that they do not operate with a DC current passing through their core mixer circuitry. Any flicker noise problems thus tend to be negligible with such mixer topologies.

Passive mixers of this type, however, are not without their own significant disadvantages. By definition, passive mixers do not provide power gain, yielding instead a signal power loss. Typically, such mixers generate output signals which are measurably less in power than the input signals. This makes for more pronounced noise contributions from other processes which follow downstream of the mixer.

Another significant disadvantage of passive type mixers is that, unlike active mixers, they do require large LO swing amplitudes. The large LO swing is necessary for switching devices of the mixer to approach ideal switching behavior. Only with the LO amplitude remaining larger than the input signal will non-linearity be minimized during mixer operation. Maintaining sufficiently large LO swing amplitudes in this regard requires substantial design challenges to be overcome, which unduly raises costs both in terms of power consumption and overall system complexity. Also, the requisite LO swing raises prohibitive concerns in some of the more advanced technologies where voltage headroom constraints are highly limiting.

There is therefore a need for a system whereby mixing may be accommodated in a way which culls the major advantages of active and passive mixer typologies substantially without the normally attendant disadvantages. There is a need for a mixing system in which power gain is realized in suitable manner, without the detrimental effects of flicker noise, and without necessitating excessively large LO swing amplitudes.

SUMMARY OF THE INVENTION

It is an object of the present invention to provide a system for variable transconductance mixing of a received signal with a local oscillator signal.

It is another object of the present invention to provide a system for variable gain transconductance of a received signal for mixing with a local oscillator signal.

It is yet another object of the present invention to provide a variable transconductance device for a mixer apparatus capable of delivering variable signal power gain in a simple yet cost effective manner.

These and other objects are attained by a variable transconductance device for a mixer apparatus formed in accordance with the present invention. The variable transconductance device includes at least one variable current source circuit having a plurality of selectively enabled current source stages, wherein each of the current source stages, when enabled, is actuable to establish a conductive path between a first supply level and an output terminal. The variable transconductance device further includes at least one variable transconductance circuit having a plurality of selectively enabled transconductance stages coupled to the current source stages. Each transconductance stage, when enabled, is actuable to establish a conductive path between a second supply level and the output terminal. An output current signal is generated at the output terminal by the variable transconductance circuit responsive to an input voltage signal. The output current signal exhibits a power gain adjustably determined responsive to the numbers of current source and transconductance stages selectively enabled in the variable current source and variable transconductance circuits.

In certain embodiments, the variable transconductance device comprises a variable current source circuit having a predetermined number, M, of current source stages and a variable transconductance circuit having a predetermined number, N, of transconductance stages. A first control signal in this embodiment may then include a first digital word applied to the variable current source circuit, which is formed by M bits each programmably set to alternatively enable and disable a corresponding one of the current source stages. The second control signal in this embodiment may include a second digital word applied to the variable transconductance circuit, which is formed by N bits each programmably set to alternatively enable and disable a corresponding one of the transconductance stages.

In certain other embodiments, the variable transconductance device comprises a variable bias generation circuit operably coupled to each variable transconductance circuit. The variable bias generation circuit includes a predetermined number, B, of bias generation stages, wherein each of the bias generation stages, when enabled, is actuable to establish a conductive path between the first supply level and the second supply level. A third control signal in this embodiment may then include a third digital word applied to the variable bias generation circuit, which is formed by B bits each programmably set to alternatively enable and disable a corresponding one of the bias generation stages.

DESCRIPTION OF THE PREFERRED EMBODIMENTS

Figure 2:
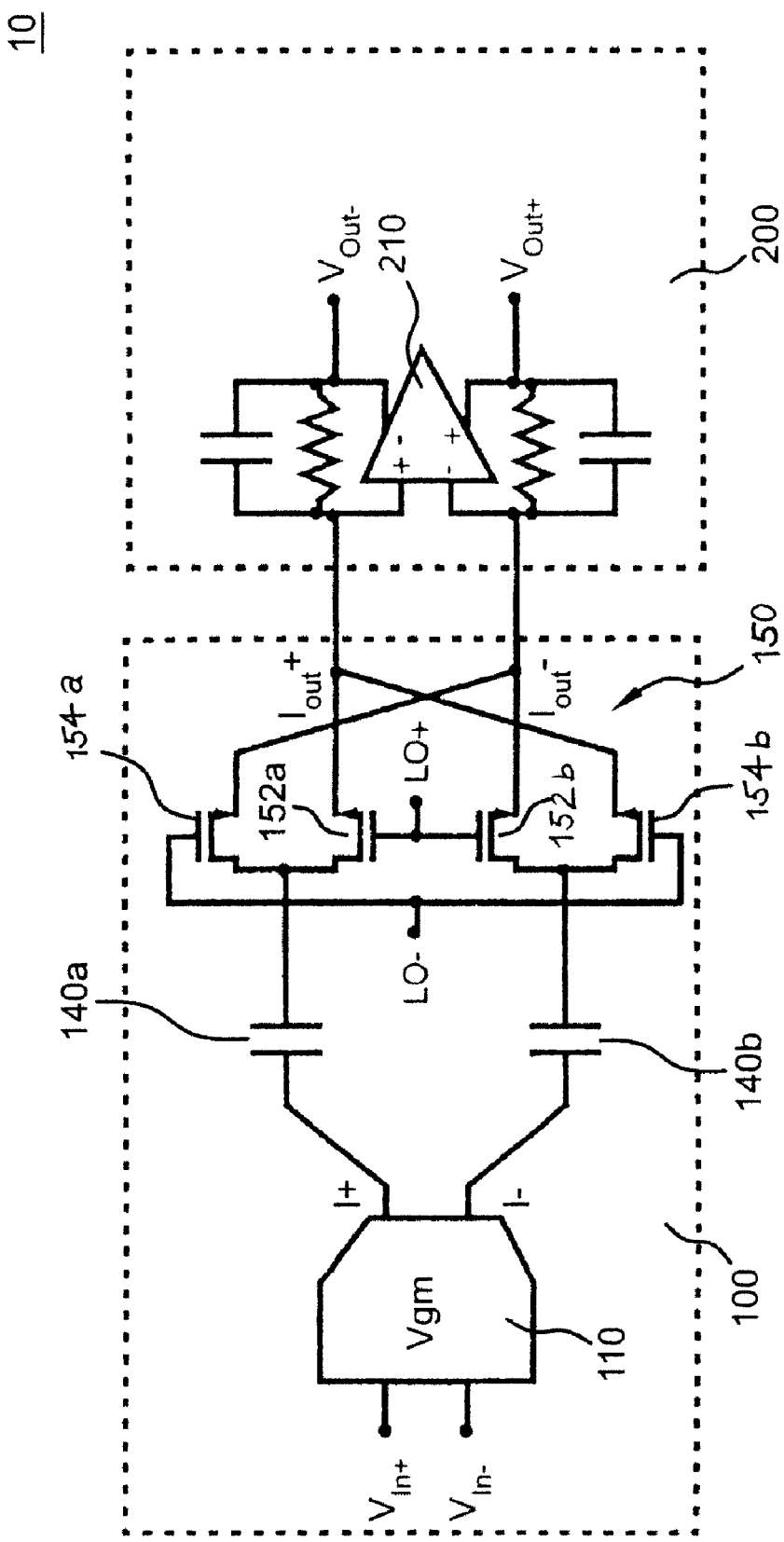
FIG. 2 is a schematic diagram illustrating the interconnection of certain components of a mixing system formed in accordance with one exemplary embodiment of the present invention.

Referring now to FIG. 2, there is schematically illustrated a variable transconductance mixer system 10 formed in accordance with an exemplary embodiment of the present invention. Generally, the apparatus incorporating variable transconductance mixing system 10 includes in this embodiment a mixer portion 100 which combines the benefits of both passive and active mixer types, and a current-to-voltage converter portion 200 coupled to convert the current signal outputs $I_{Out+}$, $I_{Out-}$ of the combined mixer portion 100 to corresponding voltage signal outputs $V_{Out+}$, $V_{Out-}$. The combined passive-active mixer portion 100 is formed generally by a variable transconductance unit 110 and a passive mixer unit 150 coupled thereto by a pair of DC-blocking capacitors 140a, 140b.

As shown, the variable transconductance unit 110 receives the positive and negative components, $V_{In+}$, $V_{In-}$ of a differential voltage input signal and generates a pair of corresponding output current signals $I_+$, $I_-$ for delivery to the mixer unit 150 respectively through the capacitors 140a, 140b. In accordance with the present invention, the variable transconductance unit 110 is selectively configured, preferably via "programmable" measures, to yield a variable signal power gain at its output terminals. The resulting current signals $I_+$, $I_-$ accommodate current mode operation of the mixer unit 150, much as for active type mixers, but without delivery of a DC current component to the mixer's core circuitry. The capacitors 140a, 140b which are series-coupled to the respective output terminals of the transconductance unit 110 ensure the blockage of any DC signal current components. Consequently, any flicker noise seen at the mixer unit 150 is negligible.

Figure 1A:
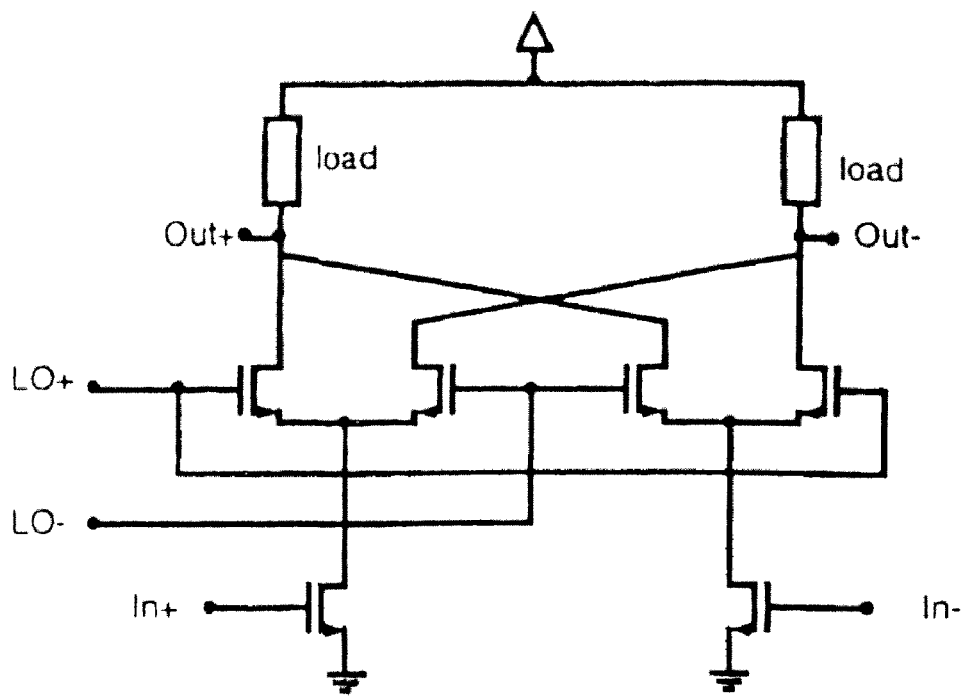
FIG. 1A is a schematic diagram illustrating an active mixer circuit known in the art.
Figure 1B:
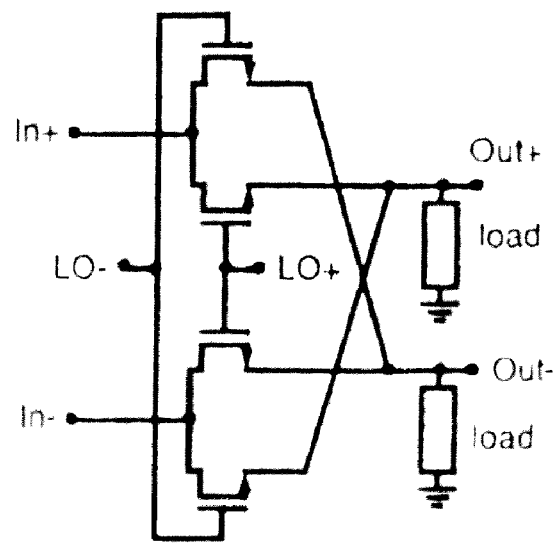
FIG. 1B is a schematic diagram illustrating a passive mixer circuit known in the art.

The mixer unit 150 is preferably of a suitable passive topology type known in the art, such as illustrated in FIG. 1B. Unlike the conventional passive mixer of FIG. 1B, however, mixer portion 150 in the illustrated embodiment operates in the current mode to generate mixed current signal outputs $I_{Out-}$ and $I_{Out+}$.

The current-to-voltage converter unit 200 receives the mixer's current signal outputs $I_{Out-}$, $I_{Out+}$ at the virtual ground nodes of a differential amplifier 210 which then generates corresponding voltage output signals $V_{Out-}$, $V_{Out+}$. differential amplifier 210 may be of any suitable differential operational amplifier device type known in the art. It is preferably configured with suitable resistive loads and capacitive elements to provide at least first order filtering of the mixed signal.

Coupling the mixed current output signals $I_{Out-}$, $I_{Out+}$ of the mixer portion 150 to the differential amplifier 210 in this manner minimizes the voltage swing at the input and output of the mixer portion 150. This alleviates the LO swing amplitudes required for linear mixing.

Figure 3:
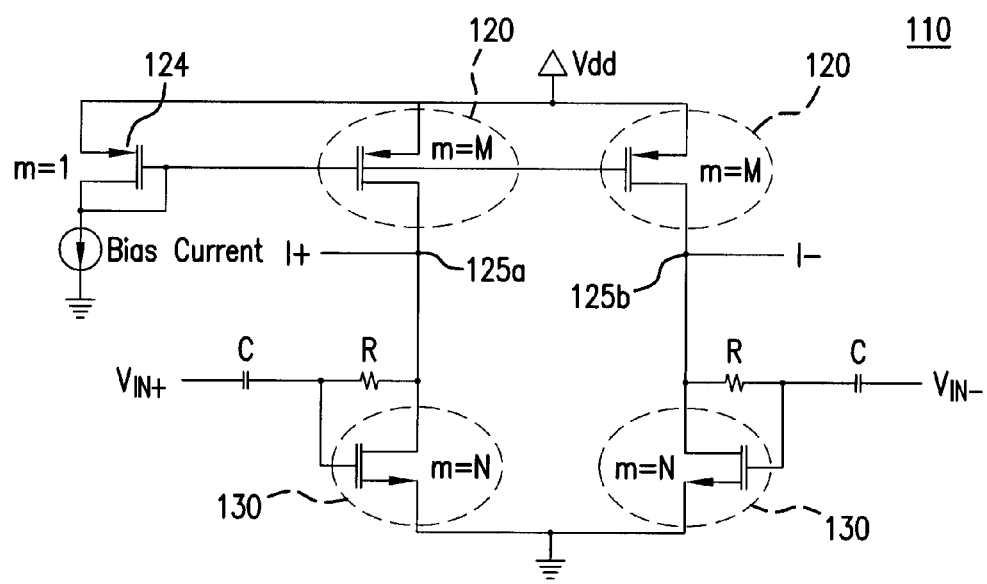
FIG. 3 is a schematic diagram illustrating the interconnection of components in a variable transconductance device of a mixing system formed in accordance with an exemplary embodiment of the present invention.

Turning next to FIG. 3, there is shown a schematic diagram illustrating a portion of the variable transconductance unit 110 formed in accordance with an exemplary embodiment of the present invention. The unit includes a plurality of variable current source circuits 120 (whose components are collectively represented for simplicity by the circled symbology) which are operable to adjustably establish a conductive path between a supply voltage rail $V_{dd}$ and an output terminal. In the differential signal application shown, dual conductive paths are so established by respective variable current source circuits 120 coupled between $V_{dd}$ and respective positive and negative output terminals 125a, 125b.

In the embodiment shown, the variable current source circuits 120 are disposed with their shared gate terminals commonly coupled to the gate terminal of a bias generator circuit 124, and their shared source terminals are coupled to the source terminal of the bias generator circuit 124. The variable current sources' shared drain terminals are coupled to the output terminals 125a, 125b.

The variable transconductance unit 110 also includes a plurality of selectively enabled variable transconductance circuits 130 (whose components are collectively represented for simplicity by the circled symbology). When enabled, each variable transconductance circuit 130 may be switched to establish a conductive path between the given output terminal 125a, 125b and ground (or other supply rail level). Dual conductive paths are so established in the differential signal application shown by respective variable transconductance circuits 130 coupled between the respective positive and negative output terminals 125a, 125b and ground.

Each variable transconductance circuit 130 is preferably coupled effectively in a self biased in configuration, with a resistor R coupled between the shared gate and drain terminals of its transconductance stages 1300. A capacitance C is coupled between the shared gate terminal of each variable transconductance circuit 130 and a corresponding input terminal 135a, 135b.

Figure 6:
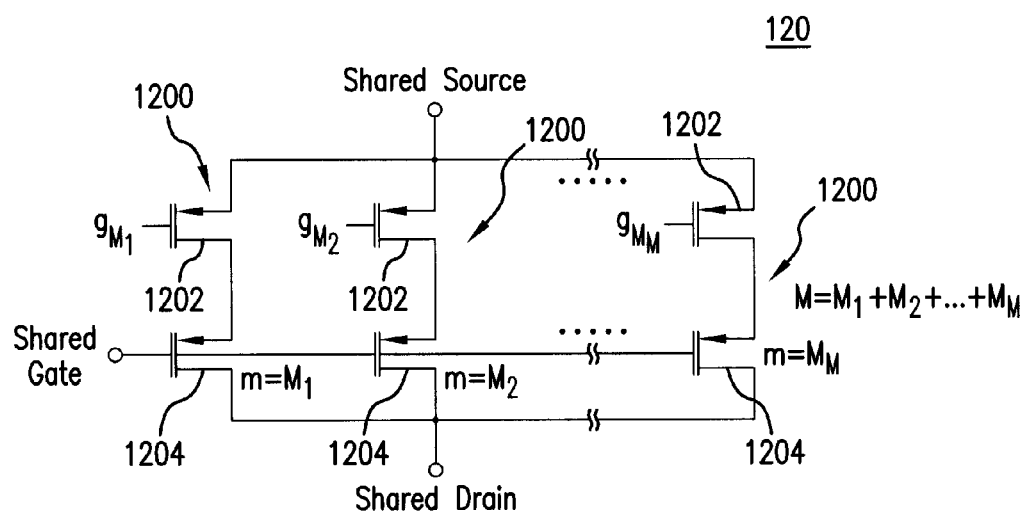
FIG. 6 is a schematic diagram illustrating the interconnection of components in an exemplary embodiment of variable current source circuit portion of the embodiments illustrated in FIGS. 3 and 4.

Each variable current source circuit 120 is illustrated in greater detail in FIG. 6. As shown, each current source circuit 120 includes a predetermined number, M, of selectively enabled current source stages 1200 coupled in parallel between shared source and drain terminals. Each current source stage is formed with a control switch component 1202 and a current source component 1204. In the illustrated embodiment, these components are preferably realized in the form of PMOS field effect transistors connected with their source-drain conductive paths coupled in series. The gates of the current source transistors 1204 are tied together at a shared gate terminal. The gates of the control switch transistors are tied for respective energization responsive to corresponding bits $g_{M1}, \ldots, g_{MM}$ of an M-bit digital control word $g_M$ applied to the variable current source circuit 120. The current source stages 1200 configured in this manner collectively provide an independently selectable series of M parallel current source components.

Figure 5:
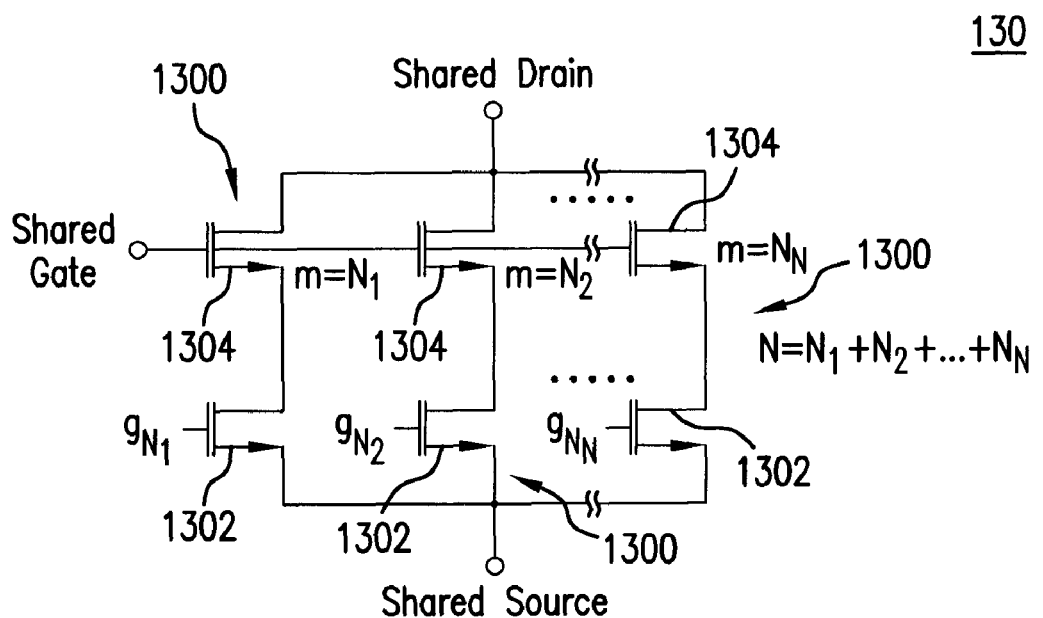
FIG. 5 is a schematic diagram illustrating the interconnection of components in an exemplary embodiment of variable transconductance circuit portion of the embodiments illustrated in FIGS. 3 and 4.

As illustrated in FIG. 5, each variable transconductance circuit 130 preferably includes a predetermined number, N, of selectively enabled transconductance stages 1300 coupled in parallel between shared drain and source terminals. Each transconductance stage is formed with a control switch component 1302 and a transconductance component 1304. In the illustrated embodiment, these components are preferably realized in the form of NMOS field effect transistors connected with their drain-source conductive paths coupled in series. The gates of the transconductance transistors 1304 are tied together at a shared gate terminal, while the gates of the control switch transistors are tied for respective energization responsive to corresponding bits $g_{N1}, g_{NN}$ of an N-bit digital control word $g_N$ applied to the variable transconductance circuit 130. The transconductance stages 1300 configured in this manner collectively provide an independently selectable series of N parallel transconductance components.

Any suitable means known in the art may be employed to selectively enable one or more of the M current source stages 1200 and N transconductance stages 1300. The actual devices forming the switching, current source, and transconductance components in the current source and transconductance stages 1200, 1300 may be of any suitable type and configuration known in the art, as determined by the particular requirements of the intended application.

Preferably, physical and electrical properties of the devices employed are suitably set such that the number of available current source stages actually enabled in the variable current source circuits 120, combined with the number of available transconductance stages actually enabled in the variable transconductance circuits 130, will determine a unique gain value from a stepped series of available gain settings. The signal power gain to be provided by the variable transconductance unit 110 may then be programmably set by suitably setting one or more multi-bit digital words formed by mixer gain bits whose binary values would map to the set of available gain settings.

If, for example, a three-bit programmable mixer gain word, g, were used for gain settings spanning a 30 dB range at 5 dB increments, the mapping of binary values to gain level may be established as follows:

| State of g (Binary) | Level of Power Gain (dB) |
|---|---|
| 111 | maximum gain |
| 110 | 5 dB lower than maximum gain |
| 101 | 10 dB lower than maximum gain |
| 100 | 15 dB lower than maximum gain |
| 011 | 20 dB lower than maximum gain |
| 010 | 25 dB lower than maximum gain |
| 001 | 30 dB lower than maximum gain |
| 000 | Off |

Figure 8:
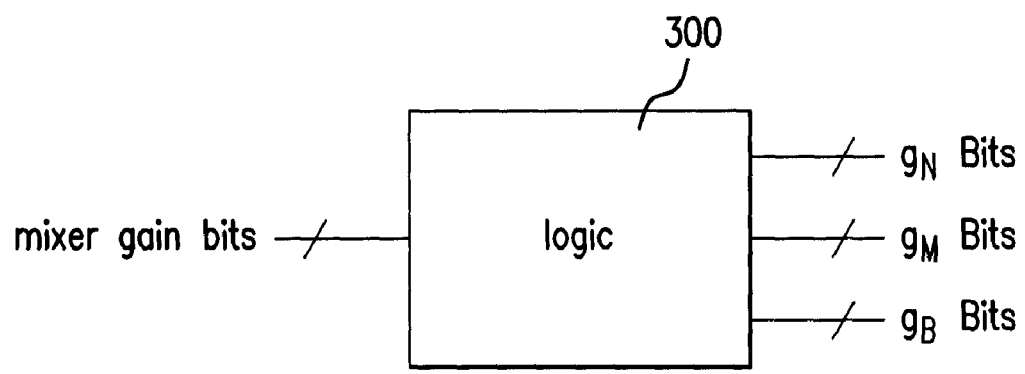

The digital control words $g_M$, $g_N$, and where applicable $g_B$ (described in following paragraphs) are preferably set responsive to the mixer gain word g. This is illustrated in FIG. 8, wherein a logic block 300 is provided to receive the mixer gain bits of word g and automatically generate the control words $g_M$, $g_N$, and/or $g_B$ consistent therewith. Logic block 300 may be configured in any suitable manner according on the particular requirements of the intended application. The combination of control words generated thereby selectively determines the current consumption, linearity, gain, and noise properties of the variable transconductance unit 110.

A mapping of mixer gain word g to the required control words $g_M$, $g_N$, and/or $g_B$ may be carried out in any suitable manner known in the art. It may be carried out in hardware, or in software. For example, a lookup table may be consulted to set the corresponding control words for particular mixer gain word values.

Figure 4:
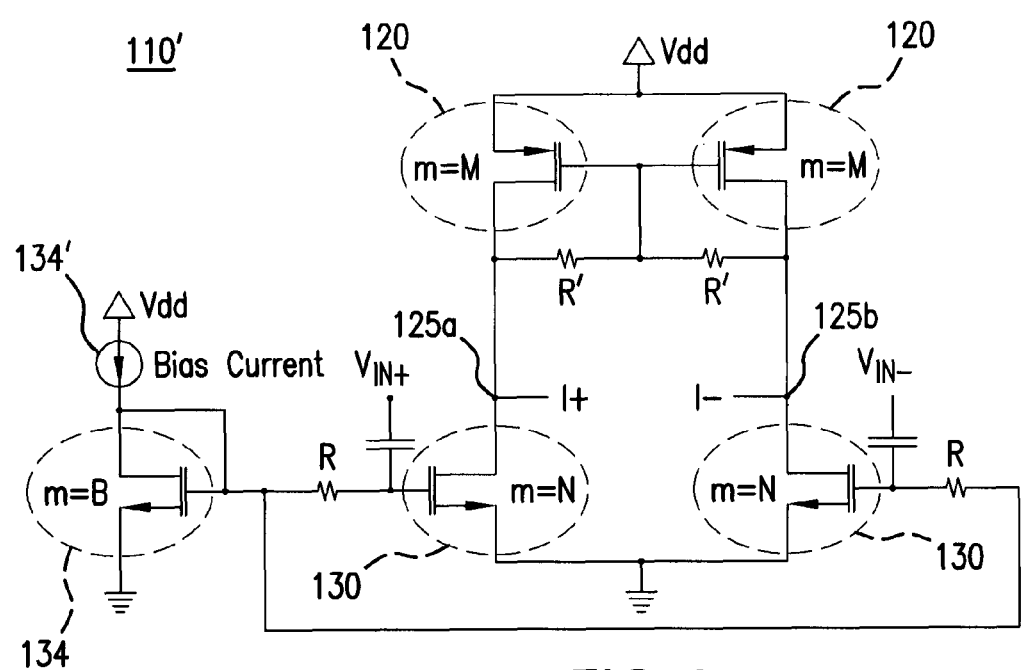
FIG. 4 is a schematic diagram illustrating the interconnection of components in a variable transconductance device of a mixing system formed in accordance with an alternate exemplary embodiment of the present invention.

Referring now to FIG. 4, there is shown a schematic diagram illustrating an alternate embodiment 110' of a variable transconductance unit similar in configuration to that shown in FIG. 3. Elements identical to those shown in FIG. 3 are marked with identical reference characters.

In the embodiment of FIG. 4, the variable current source circuits 120 are disposed effectively in self-biased configurations to serve effectively as variable PMOS loads. The shared gate terminals of these variable current source circuits 120 are tied together as shown, with the shared gate terminal of each circuit 120 coupled via a resistance R' to its shared drain terminal (at output terminals 125a, 125b).

Figure 7:
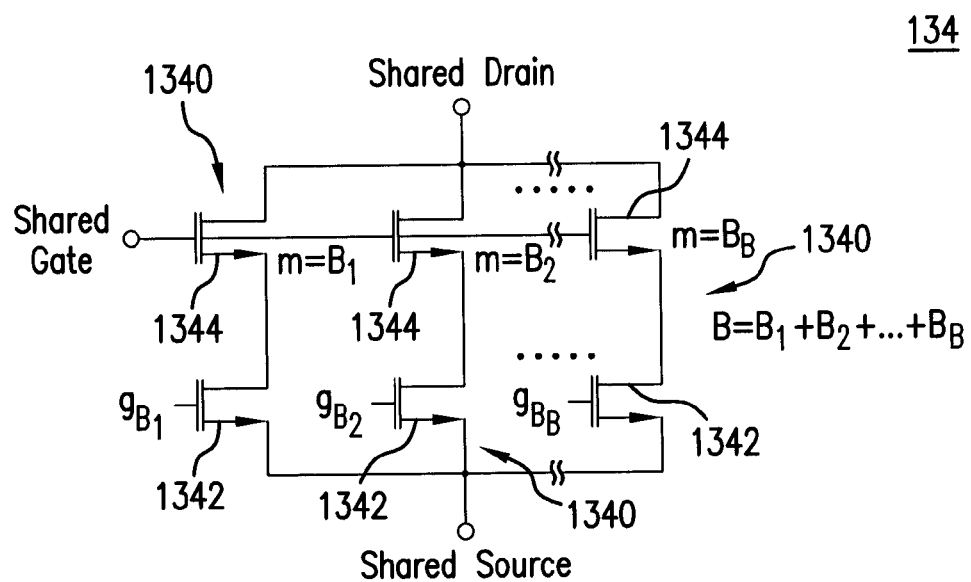
FIG. 7 is a schematic diagram illustrating the interconnection of components in an exemplary embodiment of variable bias generation circuit portion of the embodiment illustrated in FIG. 4; and, FIG. 8 is a schematic diagram illustrating a logic block portion generating a set of digital control words responsive to a mixer gain word input for an exemplary embodiment of the variable transconductance device of the present invention.

A bias current is applied to the shared gate terminal of each variable transconductance circuit 130, via a resistance R. The bias current in this embodiment is provided in variable manner by a variable bias current generation circuit 134. As illustrated in FIG. 7, circuit 134 may be implemented in much the manner that the variable transconductance circuit 130 of FIG. 5 is illustratively implemented. Circuit 134 preferably includes a predetermined number, B, of selectively enabled bias generation stages 1340 coupled in parallel between shared drain and source terminals. Each bias generation stage 1340 is formed with a control switch component 1342 and a bias component 1344. In the illustrated embodiment, these components are preferably realized in the form of NMOS field effect transistors connected with their drain-source conductive paths coupled in series. The gates of the bias transistors 1344 are tied together at a shared gate terminal. The gates of the control switch transistors 1342 are tied for respective energization responsive to corresponding bits $g_{B1}, \ldots, g_{BB}$ of a B-bit digital control word $g_B$ applied to the variable bias generation circuit 134. The bias generation stages 1340 configured in this manner collectively provide an independently selectable series of B parallel bias generation components.

The variable bias generation circuit 134 is configured as shown with its shared gate and drain terminals coupled together. The shared drain terminal is preferably coupled to a current source 134' connected to the supply voltage rail $V_{dd}$, while the shared source terminal is connected to ground (or other supply rail level).

In accordance with the present invention, variable signal gain may be delivered by the variable transconductance unit 110, 110' based upon programmable selection of the M and N available current source and transconductance stages 1200, 1300 (and, where available, the B bias generation stages 1340). For each selectable gain setting, the numbers of enabled stages 1200, 1300 (and 1340) are selected such that the gate-to-source voltages (VGS) of the transistor devices in the transconductance stages 1300 are set to the highest permissible value in view of the voltage headroom constraint limits prevailing in the given application. This ensures that for each gain setting, input compression is maximized for the given current consumption.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of processing steps and functional components may be reversed or interposed, all without departing from the spirit or scope of the invention as defined in the appended claims.

What is claimed is:

1. A variable transconductance device for a mixer apparatus comprising:
    at least one variable current source circuit having a plurality of selectively enabled current source stages, wherein each said current source stage is independently enabled one relative to the other responsive to a respective current source stage control signal, each said current source stage when enabled being actuable to establish a conductive path between a first supply level and an output terminal; and,
    at least one variable transconductance circuit having a plurality of selectively enabled transconductance stages, wherein each said transconductance stage is independently enabled one relative to the other responsive to a respective transconductance stage control signal, each said transconductance stage when enabled being actuable to establish a conductive path between a second supply level and said output terminal;
    wherein an output current signal is generated at said output terminal responsive to an input voltage signal, the output current signal exhibiting a power gain adjustably determined responsive to the numbers of said current source and transconductance stages selectively enabled in the variable current source and variable transconductance circuits;
    wherein said current source stages each include a control switch component and a current source component coupled in series; and, said transconductance stages each include a control switch component and a transconductance component coupled in series.

2. The variable transconductance device as recited in claim 1, comprising a predetermined number, M, of said current source stages selectively enabled by said current source stage control signal and a predetermined number, N, of said transconductance stages selectively enabled by a transconductance stage control signal;
    wherein said current source stage control signal includes a first digital word formed by M bits each programmably set to alternatively enable and disable a corresponding one of said current source stages, and said transconductance stage control signal includes a second digital word formed by N bits each programmably set to alternatively enable and disable a corresponding one of said transconductance stages.

3. The variable transconductance device as recited in claim 1, wherein said control switch and current source components of said current source stages are each formed by a field effect transistor; said current source components of said current source stages having interconnected gate terminals and interconnected drain terminals, said control switch components of said current source stages being disposed to collectively receive said first control signal at gate terminals thereof.

4. The variable transconductance device as recited in claim 3, wherein said control switch and current source components of each said current source stage are formed by respective PMOS field effect transistors defining source-drain conductive paths coupled in series.

5. The variable transconductance device as recited in claim 1, wherein said control switch and transconductance components of said transconductance stages are each formed by a field effect transistor; said transconductance components of said transconductance stages having interconnected gate terminals and interconnected drain terminals, said control switch components of said transconductance stages being disposed to collectively receive said second control signal at gate terminals thereof.

6. The variable transconductance device as recited in claim 5, wherein said control switch and transconductance components of each said transconductance stage are formed by respective NMOS field effect transistors defining drain-source conductive paths coupled in series.

7. The variable transconductance device as recited in claim 1, wherein a pair of variable current source circuits are disposed respectively in positive and negative signal branches for differential signal operation.

8. The variable transconductance device as recited in claim 1, wherein a pair of variable transconductance circuits are disposed respectively in positive and negative signal branches for differential signal operation.

9. The variable transconductance device as recited in claim 2, further comprising a variable bias current generation circuit coupled to said variable transconductance circuit, said variable bias current generation circuit including a predetermined number, B, of bias generation stages each selectively enabled responsive to a bias control signal to establish a conductive path between the first and second supply levels, said bias generation stages thereby adjustably setting a bias current signal for said transconductance stages.

10. The variable transconductance device as recited in claim 2, further comprising a logic block operable to automatically generate responsive to a multi-bit mixer gain word input at least an M-bit first digital control word and an N-bit second digital control word for respectively enabling selective ones of said current source and transconductance stages.

11. A variable transconductance mixer apparatus comprising:
    (a) a programmable transconductance unit including:
        at least one variable current source circuit having a plurality of current source stages wherein each said current source stage is independently enabled one relative to the other responsive to a respective current source stage control signal, each said current source stage when enabled being actuable to establish a conductive path between a first supply level and an output terminal; and, at least one variable transconductance circuit having a plurality of transconductance stages wherein each said transconductance stage is independently enabled one relative to the other responsive to a respective transconductance stage control signal, each said transconductance stage when enabled being actuable to establish a conductive path between a second supply level and said output terminal;

wherein an output current signal is generated at said output terminal responsive to actuation of said enabled transconductance stages by an input voltage signal;

(b) a mixer unit coupled to said transconductance unit for receiving and passively modulating the output current signal with a local oscillator signal to generate a mixed current signal; and, (c) a current-to-voltage converter coupled to said mixer unit for receiving and converting the mixed current signal to a mixed voltage signal;

(d) a variable bias current generation circuit coupled to said variable transconductance circuit, said variable bias current generation circuit including a plurality of bias generation stages each selectively enabled responsive to a bias control signal to establish a conductive path between the first and second supply levels, said bias generation stages thereby adjustably setting a bias current signal for said transconductance stages.

12. The variable transconductance mixer apparatus as recited in claim 11, wherein said variable current source circuit includes a predetermined number, M, of said current source stages, said variable transconductance circuit includes a predetermined number, N, of said transconductance stages, and said variable bias generation circuit includes a predetermined number, B, of said bias generation stages; said current source stage control signal including a first digital word formed by M bits each programmably set to alternatively enable and disable a corresponding one of said current source stages, said transconductance stage control signal including a second digital word formed by N bits each programmably set to alternatively enable and disable a corresponding one of said transconductance stages, and said bias control signal including a third digital word formed by B bits each programmably set to alternatively enable and disable a corresponding one of said bias generation stages.

13. The variable transconductance mixer apparatus as recited in claim 12, wherein said programmable transconductance unit is configured to deliver a variable power gain, the power gain being adjustable responsive to the numbers of said current source and transconductance stages selectively enabled.

14. A variable transconductance mixer apparatus comprising:

(a) a programmable transconductance unit including:

at least one variable current source circuit having a plurality of current source stages wherein each said current source stage is independently enabled one relative to the other responsive to a respective current source stage control signal, each said current source stage when enabled being actuable to establish a conductive path between a first supply level and an output terminal; and, at least one variable transconductance circuit having a plurality of transconductance stages wherein each said transconductance stage is independently enabled one relative to the other responsive to a respective transconductance stage control signal, each said transconductance stage when enabled being actuable to establish a conductive path between a second supply level and said output terminal;

wherein an output current signal is generated at said output terminal responsive to actuation of said enabled transconductance stages by an input voltage signal;

(b) a mixer unit coupled to said transconductance unit for receiving and passively modulating the output current signal with a local oscillator signal to generate a mixed current signal; and, (c) a current-to-voltage converter coupled to said mixer unit for receiving and converting the mixed current signal to a mixed voltage signal;

wherein said input voltage signal is a differential voltage signal, and said mixer unit is coupled to said transconductance unit by a pair of capacitive elements for blocking the passage of direct current therethrough.

15. The variable transconductance mixer apparatus as recited in claim 14, wherein said mixer unit includes a first pair of field effect transistors having gate electrodes coupled to a positive local oscillator signal and a second pair of field effect transistors having gate electrodes coupled to a negative local oscillator signal.

16. The variable transconductance mixer apparatus as recited in claim 15, wherein complementary pairs of variable current source circuits and variable transconductance circuits are respectively disposed in positive and negative signal branches for differential signal operation.

17. A programmable transductance mixer apparatus comprising:

(a) a programmable transconductance unit configured to deliver a variable power gain, said variable transconductance unit including:

a complementary pair of variable current source circuits operable respectively in positive and negative branches of differential signal operation, each of said variable current source circuits having a plurality of current source stages being independently enabled one relative to the other responsive to a respective current source stage control signal, each said current source stage when enabled being actuable to establish a conductive path between a first supply level and one of a pair of output terminals; and, a complementary pair of variable transconductance circuits operable respectively in positive and negative branches of differential signal operation, each of said variable transconductance circuits having a plurality of transconductance stages coupled to said current source stages and independently enabled one relative to the other responsive to a respective transconductance stage control signal, each said transconductance stage when enabled being actuable to establish a conductive path between a second supply level and one of said pair of output terminals;

wherein a differential output current signal is generated at said output terminal pair responsive to actuation of said variable transconductance circuit by a differential input voltage signal, the differential output current signal having a power gain with respect to the differential input voltage signal, the power gain being adjustably set responsive to the numbers of said current source and transconductance stages selectively enabled;

(b) a mixer unit coupled to said transconductance unit for receiving and passively modulating the output current signal with a local oscillator signal to generate a mixed current signal; and, (c) a current-to-voltage converter coupled to said mixer unit for receiving and converting the mixed current signal to a mixed voltage signal.

18. The programmable transconductance mixer apparatus as recited in claim 17, comprising a predetermined number, M, of said variable current source circuits and a predetermined number, N, of said variable transconductance circuits; wherein said current source stage control signal includes a first digital word formed by M bits each programmably set to alternatively enable and disable a corresponding one of said current source stages, and said transconductance stage control signal includes a second digital word formed by N bits each programmably set to alternatively enable and disable a corresponding one of said transconductance stages.

* * * * *